(12) United States Patent
Kuo

(10) Patent No.: US 6,928,334 B2
(45) Date of Patent: Aug. 9, 2005

(54) MECHANISM FOR INTER-FAB MASK PROCESS MANAGEMENT

(75) Inventor: Birgie Kuo, Yongkang (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 48 days.

(21) Appl. No.: 10/625,432

(22) Filed: Jul. 23, 2003

(65) Prior Publication Data

US 2005/0021165 A1 Jan. 27, 2005

(51) Int. Cl.⁷ .............................................. G06F 19/00
(52) U.S. Cl. ................................... 700/115; 700/121
(58) Field of Search ............................... 700/115, 121, 700/222, 229; 716/19

(56) References Cited

U.S. PATENT DOCUMENTS

| | | | |
|---|---|---|---|
| 5,841,660 A | * 11/1998 | Robinson et al. | 700/115 |
| 6,366,824 B1 | * 4/2002 | Nair et al. | 700/115 |
| 6,529,789 B1 | * 3/2003 | Campbell et al. | 700/115 |
| 6,537,844 B1 | 3/2003 | Itoh | |
| 6,760,640 B2 | * 7/2004 | Suttile et al. | 700/121 |
| 2001/0047222 A1 | * 11/2001 | Wiesler et al. | 700/214 |
| 2002/0044266 A1 | * 4/2002 | Charles et al. | 355/53 |

OTHER PUBLICATIONS

Kuo, Birgie, "Enterprise Mask Process Management", MIT e–Operations Symposium, Taiwan Semiconductor Manufacturing Co., Ltd. Manufacturing Information Technology Division (TSMC MITD), Jun. 2003, 10 pages.

* cited by examiner

*Primary Examiner*—Leo Picard
*Assistant Examiner*—Alexander Kosowski
(74) *Attorney, Agent, or Firm*—Haynes and Boone, LLP

(57) ABSTRACT

A software mechanism is provided for inter-fab mask process management. The mechanism is used for tracking and managing a plurality of lithographic masks through a semiconductor manufacturing environment. A virtual fab is established with a plurality of entities, each entity associated with an internal process to a semiconductor fab or an external process to the semiconductor fab. A state diagram tracks the plurality of lithographic masks through the plurality of entities of the virtual fab. Each of the plurality of lithographic masks is placed at a pre-determined state of the state diagram and a future location for each of the masks in the virtual fab is determined via the state diagram.

15 Claims, 10 Drawing Sheets

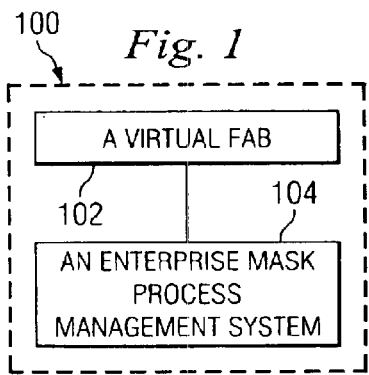
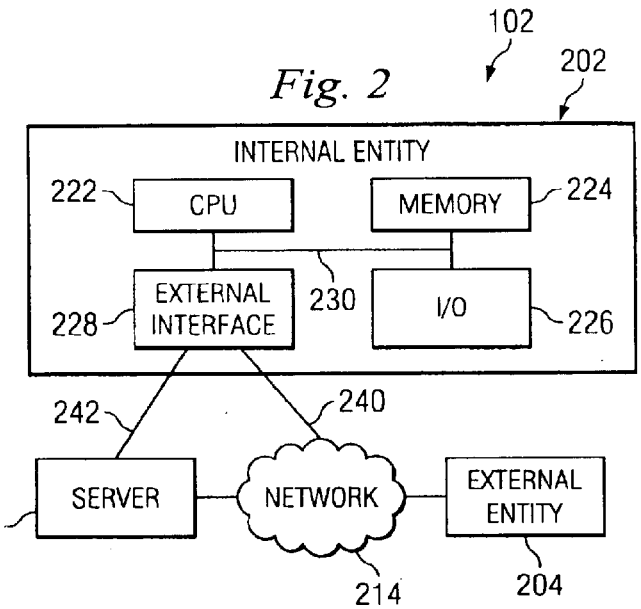
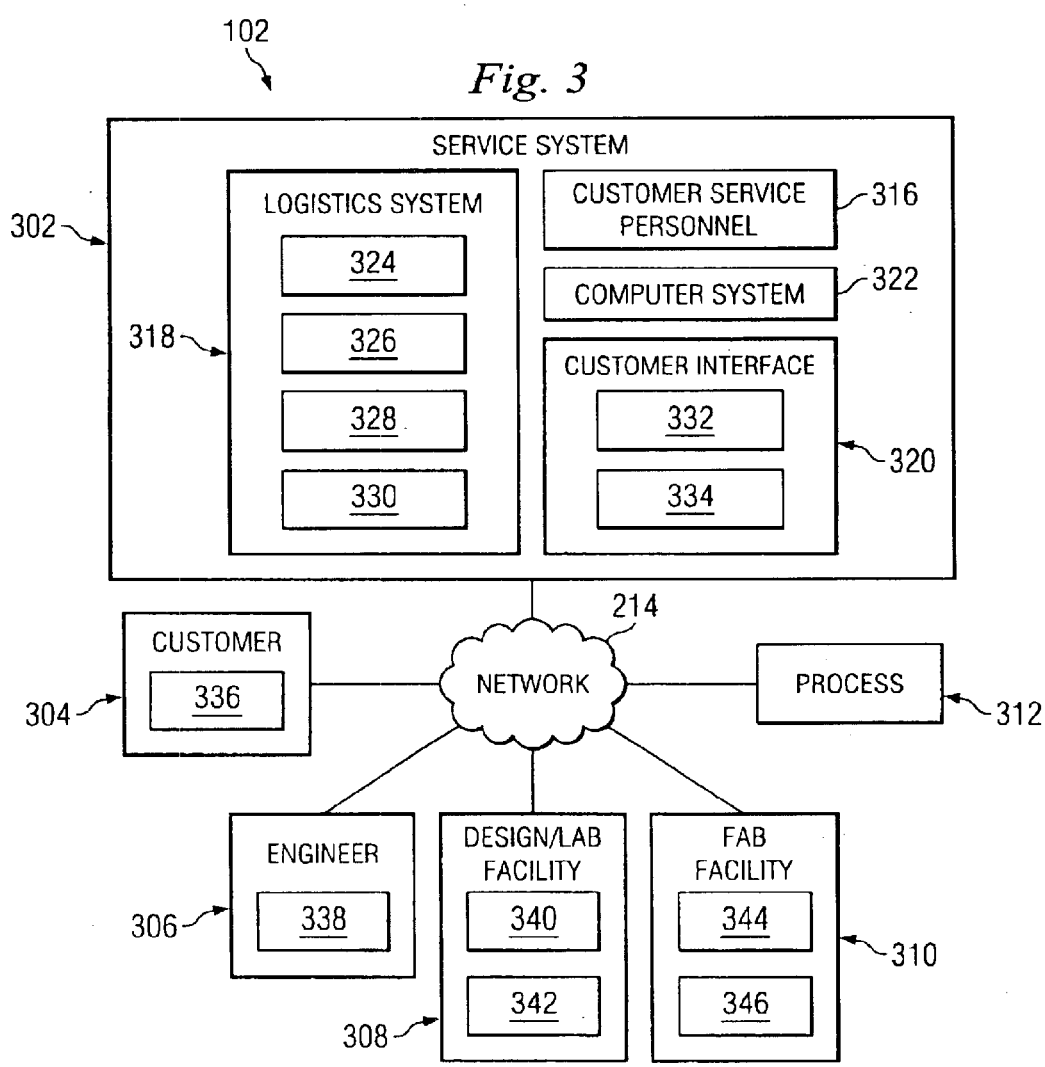

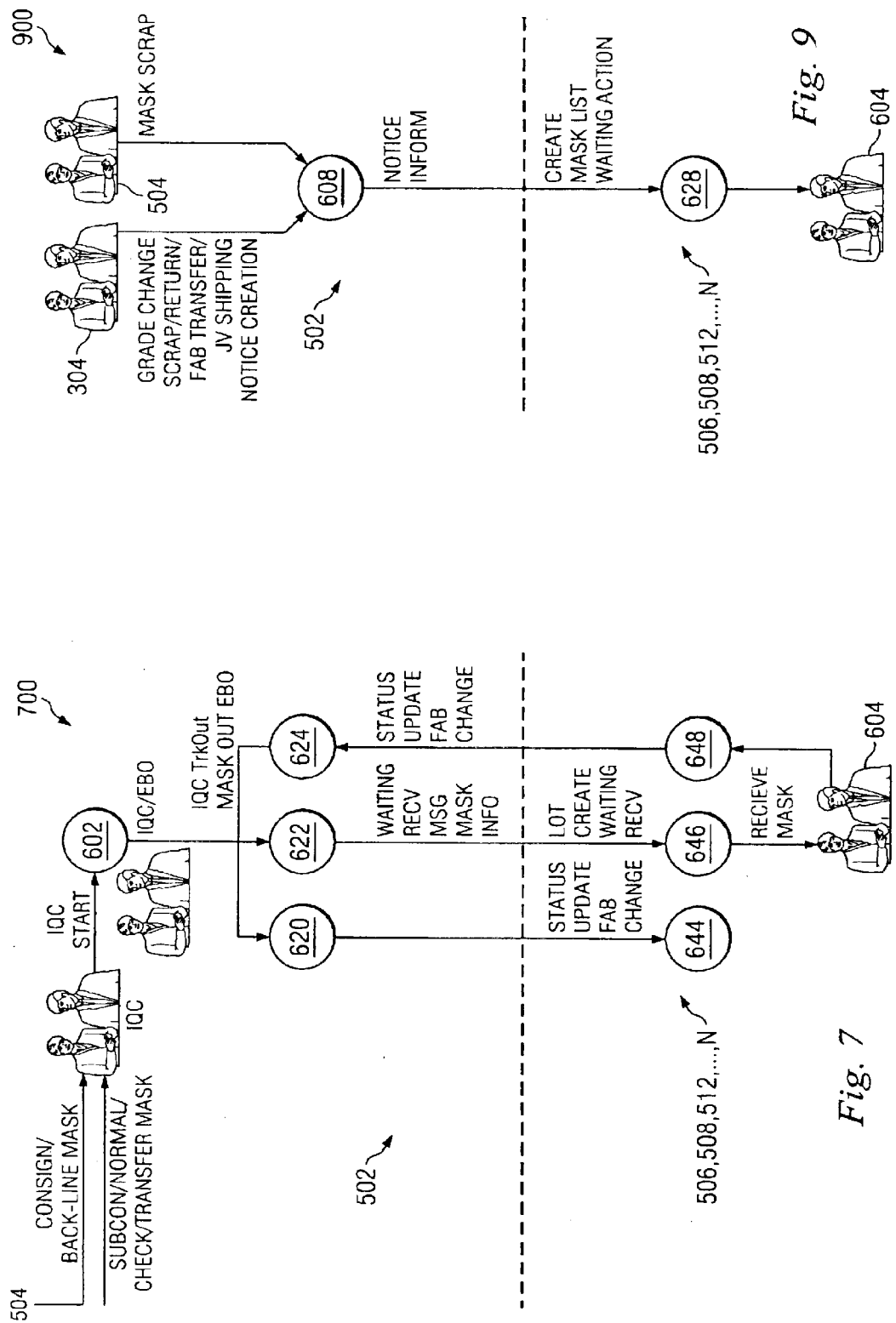

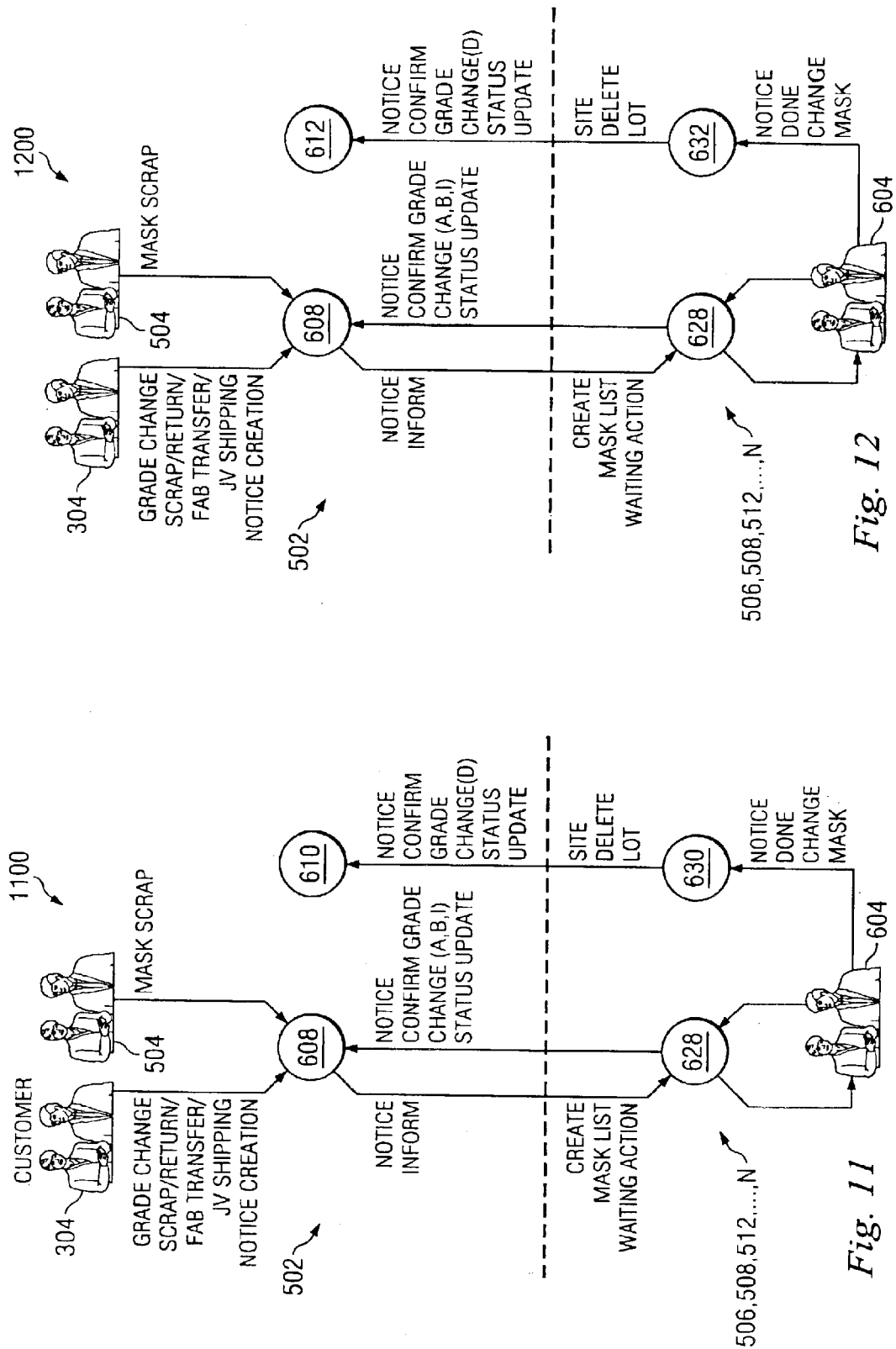

MECHANISM FOR INTER-FAB MASK PROCESS MANAGEMENT

BACKGROUND

The present disclosure relates generally to the field of semiconductor manufacturing and, more particularly, to a system and method for semiconductor mask process management.

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing have been needed. For example, an IC is formed by creating one or more devices (e.g., circuit components) on a substrate using a fabrication process. As the geometry of such devices is reduced to the submicron or deep submicron level, the IC's active device density (i.e., the number of devices per IC area) and functional density (i.e., the number of interconnected devices per IC area) has become limited by the fabrication process.

Furthermore, as the IC industry has matured, the various operations needed to produce an IC may be performed at different locations by a single company or by different companies that specialize in a particular area. This further increases the complexity of producing ICs, as companies and their customers may be separated not only geographically, but also by time zones, making effective communication more difficult. For example, a first company (e.g., an IC design house) may design a new IC, a second company (e.g., an IC foundry) may provide the processing facilities used to fabricate the design, and a third company may assemble and test the fabricated IC. A fourth company may handle the overall manufacturing of the IC, including coordination of the design, processing, assembly, and testing operations.

The complexity of process steps and time-consuming process of manufacturing advanced semiconductor devices mandates efficient processing systems and methods, specifically the control of lithographic mask design, facilitation, and organizational processes for the fabrication and management of masks. Furthermore, the cost of fabrication of lithographic masks or reticles increases as device design rules scale down and the management of such masks becomes an ever increasing concern. The valuable masks and/or reticles can be shared between fabrication facilities, however the management of reticles and/or masks can provide problems in organization such as communication problems between fabs, wherein different definitions or manufacturing executing systems (MES) may be employed. Other lithographic technologies are also being implemented such as maskless lithography. A maskless lithographic system may utilize an enormous amount of data and therefore the integrity of such mask data is important.

Accordingly, what is needed is a system and method for providing an effective mask process management system in a semiconductor manufacturing environment.

SUMMARY OF THE DISCLOSURE

The present invention provides a mechanism for inter-fab mask process management. In one embodiment, a method is provided for tracking and managing a plurality of lithographic masks through a semiconductor manufacturing environment. A virtual fab is established with a plurality of entities, each entity associated with an internal process to a semiconductor fab or an external process to the semiconductor fab. A state diagram tracks the plurality of lithographic masks through the plurality of entities of the virtual fab. Each of the plurality of lithographic masks is placed at a pre-determined state of the state diagram and a future location for each of the masks in the virtual fab is determined via the state diagram.

In another embodiment, a system is provided for tracking and managing a plurality of lithographic masks through a semiconductor manufacturing environment. The system comprises a first group of instructions for establishing a virtual fab having a plurality of entities, a second group of instructions for establishing an enterprise mask management system, and a third group of instructions for establishing a plurality of state diagrams. The state diagrams have a plurality of states corresponding to the entities of the virtual fab, and the progression through the states is controlled by the enterprise mask management system. The system also includes one or more memories for storing the first or second group of instructions.

In another embodiment, a software program is provided for tracking and managing a plurality of lithographic masks through a semiconductor manufacturing environment. The software program includes instructions for establishing a virtual fab with a plurality of entities, each entity associated with an internal process to a semiconductor fab or an external process to the semiconductor fab. The software program also includes a state diagram for tracking the plurality of lithographic masks through the plurality of entities of the virtual fab. The software program also includes a communications interface for placing each of the plurality of lithographic masks at a pre-determined state of the state diagram. The software program also includes instructions for determining a future location for each of the mask in the virtual fab via the state diagram.

In some embodiments, the virtual fab includes at least one entity associated with a first lithographic processing system in the semiconductor fab, at least one entity associated with a second lithographic processing system in the semiconductor fab, at least one entity associated with a manufacturer of the lithographic masks, at least one entity associated with a customer of products being manufactured by the semiconductor fab, and at least one entity associated with engineering support for the either or both of the first and second lithographic processing systems.

BRIEF DESCRIPTION OF THE DRAWINGS

FIG. 1 illustrates a system for providing an effective mask process management system in a semiconductor manufacturing environment.

FIG. 2 is an illustration of a virtual IC fabrication system that can benefit from one embodiment of the present disclosure.

FIG. 3 is an illustration of a more detailed example of the system of FIG. 2.

FIGS. 7–16 illustrate sub-processes within the enterprise mask process management system of which the system and method of FIGS. 1 and 4 may be performed within a virtual fab.

DETAILED DESCRIPTION

Figure 4:
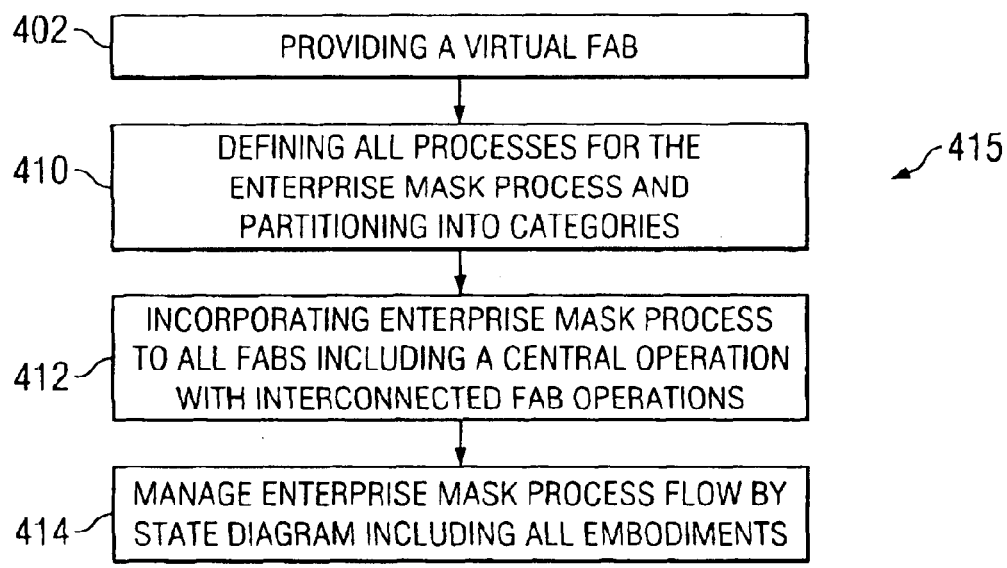
FIG. 4 illustrates a method for providing an effective mask process management system in a semiconductor manufacturing environment.

The present disclosure relates generally to the field of semiconductor manufacturing and, more particularly, to a system and method for providing an effective mask process management system in a semiconductor manufacturing environment. It is understood, however, that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, in one embodiment, a system 100 for providing an effective mask process management system in a semiconductor manufacturing environment is provided. The system 100 may include at least two components 102 and 104. Component 102 represents a virtual IC fabrication system (a "virtual fab"). Component 104 represents an enterprise mask process management system. The enterprise mask process management system 104 can include all inter-fab mask process flows and mask information services to business user/system either internal or external customers. The enterprise mask process management system 104 may provide a mapping of the enterprise processes across all embodiments. The enterprise process mapping may be accomplished by state diagrams and control of such graphical representations thereof.

Referring now to FIG. 2, one embodiment of the virtual fab 102 includes a plurality of entities, represented by one or more internal entities 202 and one or more external entities 204 that are connected by a communications network 214. The network 214 may be a single network or may be a variety of different networks, such as an intranet and the Internet, and may include both wireline and wireless communication channels.

Each of the entities 202, 204 may include one or more computing devices such as personal computers, personal digital assistants, pagers, cellular telephones, and the like. For the sake of example, the internal entity 202 is expanded to show a central processing unit (CPU) 222, a memory unit 224, an input/output (I/O) device 226, and an external interface 228. The external interface may be, for example, a modem, a wireless transceiver, and/or one or more network interface cards (NICs). The components 222–228 are interconnected by a bus system 230. It is understood that the internal entity 202 may be differently configured and that each of the listed components may actually represent several different components. For example, the CPU 222 may actually represent a multi-processor or a distributed processing system; the memory unit 224 may include different levels of cache memory, main memory, hard disks, and remote storage locations; and the I/O device 226 may include monitors, keyboards, and the like.

The internal entity 202 may be connected to the communications network 214 through a wireless or wired link 240, and/or through an intermediate network 242, which may be further connected to the communications network. The intermediate network 242 may be, for example, a complete network or a subnet of a local area network, a company wide intranet, and/or the Internet. The internal entity 202 may be identified on one or both of the networks 214, 242 by an address or a combination of addresses, such as a media control access (MAC) address associated with the network interface 228 and an internet protocol (IP) address. Because the internal entity 202 may be connected to the intermediate network 242, certain components may, at times, be shared with other internal entities. Therefore, a wide range of flexibility is anticipated in the configuration of the internal entity 202. Furthermore, it is understood that, in some implementations, a server 244 may be provided to support multiple internal entities 202. In other implementations, a combination of one or more servers and computers may together represent a single entity.

In the present example, the internal entities 202 represents those entities that are directly responsible for producing the end product, such as a wafer or individually tested IC devices. Examples of internal entities 202 include an engineer, customer service personnel, an automated system process, a design or fabrication facility and fab-related facilities such as raw-materials, shipping, assembly or test. Examples of external entities 204 include a customer, a design provider; and other facilities that are not directly associated or under the control of the fab. In addition, additional fabs and/or virtual fabs can be included with the internal or external entities. Each entity may interact with other entities and may provide services to and/or receive services from the other entities.

It is understood that the entities 202–204 may be concentrated at a single location or may be distributed, and that some entities may be incorporated into other entities. In addition, each entity 202, 204 may be associated with system identification information that allows access to information within the system to be controlled based upon authority levels associated with each entities identification information.

The virtual fab 102 enables interaction among the entities 202–204 for purposes related to IC manufacturing, as well as the provision of services. In the present example, IC manufacturing can include one or more of the following steps:

receiving or modifying a customer's IC order of price, delivery, and/or quantity;

receiving or modifying an IC design;

receiving or modifying a process flow;

receiving or modifying a circuit design;

receiving or modifying a mask change;

receiving or modifying testing parameters;

receiving or modifying assembly parameters; and receiving or modifying shipping of the ICs.

One or more of the services provided by the virtual fab 102 may enable collaboration and information access in such areas as design, engineering, and logistics. For example, in the design area, the customer 204 may be given access to information and tools related to the design of their product via the fab (internal entity 202). The tools may enable the customer 204 to perform yield enhancement analyses, view layout information, and obtain similar information. In the engineering area, the engineer (another internal entity 202) may collaborate with other engineers 202 using fabrication information regarding pilot yield runs, risk analysis, quality, and reliability. The logistics area may provide the customer 204 with fabrication status, testing results, order handling, and shipping dates. It is understood that these areas are exemplary, and that more or less information may be made available via the virtual fab 102 as desired. Another service provided by the virtual fab 102 may integrate systems between facilities, such as between a facility 204 and the fab 202. Such integration enables facilities to coordinate their activities. For example, integrating the design facility 204 and the fab 202 may enable design information to be incorporated more efficiently into the fabrication process, and may enable data from the fabrication process to be returned to the design facility 204 for evaluation and incorporation into later versions of an IC.

Referring now to FIG. 3, another embodiment of the virtual fab 102 includes a plurality of entities 302, 304, 306, 308, 310, and 312 that are connected by a communications network 214. In the present example, the entity 302 represents a service system, the entity 304 represents a customer, the entity 306 represents an engineer, the entity 308 represents a design/lab facility for IC design and testing, the entity 310 represents a fab facility, and the entity 312 represents a process (e.g., an automated fabrication process) either inside the fab 310, or at another facility. Each entity may interact with other entities and may provide services to and/or receive services from the other entities.

The service system 302 provides an interface between a customer's internal system (e.g., a computer database) and the IC manufacturing operations. For example, the service system 302 may include customer service personnel 316, a logistics system 318 for order handling and tracking, and a customer interface 320 for enabling a customer to directly access various aspects of an order.

The logistics system 318 may include a work-in-process (WIP) inventory system 324, a product data management system 326, a lot control system 328, and a manufacturing execution system (MES) 330. The WIP inventory system 324 may track working lots using a database (not shown). The product data management system 326 may manage product data and maintain a product database (not shown). The product database could include product categories (e.g., part, part numbers, and associated information), as well as a set of process stages that are associated with each category of products. The lot control system 328 may convert a process stage to its corresponding process steps.

The MES 330 may be an integrated computer system representing the methods and tools used to accomplish production. In the present example, the primary functions of the MES 330 may include collecting data in real time, organizing and storing the data in a centralized database, work order management, workstation management, process management, inventory tracking, and document control. The MES 330 may be connected to other systems both within the service system 302 and outside of the service system 302. Examples of the MES 330 include Promis, Workstream, Poseidon, and Mirl-MES. Each MES may have a different application area. For example, Mirl-MES may be used in applications involving packaging, liquid crystal displays (LCDs), and printed circuit boards (PCBs), while Promis, Workstream, and Poseidon may be used for IC fabrication and thin film transistor LCD (TFT-LCD) applications. The MES 330 may include such information as a process step sequence for each product.

The customer interface 320 may include an online system 332 and an order management system 334. The online system 332 may function as an interface to communicate with the customer 304, such as through email or other electronic means. The online system 332 may also function as an interface to other systems within the service system 302, supporting databases (not shown), and other entities 306-312. The order management system 334 may manage client orders and may be associated with a supporting database (not shown) to maintain client information and associated order information.

Portions of the service system 302, such as the customer interface 320, may be associated with a computer system 322 or may have their own computer systems. In some embodiments, the computer system 322 may include multiple computers (FIG. 4), some of which may operate as servers to provide services to the customer 304 or other entities. The service system 302 may also provide such services as identification validation and access control, both to prevent unauthorized users from accessing data and to ensure that an authorized customer can access only their own data.

The customer 304 may obtain information about the manufacturing of its ICs via the virtual fab 102 using a computer system 336. In the present example, the customer 304 may access the various entities 302, 306–312 of the virtual fab 102 through the customer interface 320 provided by the service system 302. However, in some situations, it may be desirable to enable the customer 304 to access other entities without going through the customer interface 320. For example, the customer 304 may directly access the fab facility 310 to obtain fabrication related data.

The engineer 306 may collaborate in the IC manufacturing process with other entities of the virtual fab 102 using a computer system 338. The virtual fab 102 enables the engineer 306 to collaborate with other engineers and the design/lab facility 308 in IC design and testing, to monitor fabrication processes at the fab facility 310, and to obtain information regarding test runs, yields, etc. In some embodiments, the engineer 306 may communicate directly with the customer 304 via the virtual fab 102 to address design issues and other concerns.

The design/lab facility 308 provides IC design and testing services that may be accessed by other entities via the virtual fab 102. The design/lab facility 308 may include a computer system 340 and various IC design and testing tools 342. The IC design and testing tools 342 may include both software and hardware.

The fab facility 310 enables the fabrication of ICs. Control of various aspects of the fabrication process, as well as data collected during the fabrication process, may be accessed via the virtual fab 102. The fab facility 310 may include a computer system 344 and various fabrication hardware and software tools and equipment 346. For example, the fab facility 310 may include an ion implantation tool, a chemical vapor deposition tool, a thermal oxidation tool, a sputtering tool, and various optical imaging systems, as well as the software needed to control these components.

The process 312 may represent any process or operation that occurs within the virtual fab 102. For example, the process 312 may be an order process that receives an IC order from the customer 304 via the service system 302, a fabrication process that runs within the fab facility 310, a design process executed by the engineer 306 using the design/lab facility 308, or a communications protocol that facilities communications between the various entities 302–312.

It is understood that the entities 302–312 of the virtual fab 102, as well as their described interconnections, are for purposes of illustration only. For example, it is envisioned that more or fewer entities, both internal and external, may exist within the virtual fab 102, and that some entities may be incorporated into other entities or distributed. For example, the service system 302 may be distributed among the various entities 306–310.

Referring now to FIG. 4, in another embodiment, a method 415 for providing an effective mask process management system in a semiconductor manufacturing environment is provided. The method 415 may include four steps 402, 410, 412, and 414 wherein step 402 may incorporate providing the virtual fab system 102 such as is discussed above. In step 410 all processes for the enterprise mask process may be partitioned into categories, for example there may be two major categories. The two major categories may comprise a mask use management and a mask manufacture management category. The enterprise mask process can include all inter-fab mask process flows and mask information services to business user/system either internal or external customers. Step 412 may provide incorporation of the enterprise mask process to all fabs and associated components. Finally, step 414 can provide management of the enterprise mask process flow by state diagrams including all embodiments. The enterprise process management may be accomplished by state diagrams and control of such graphical representations thereof.

Figure 5:
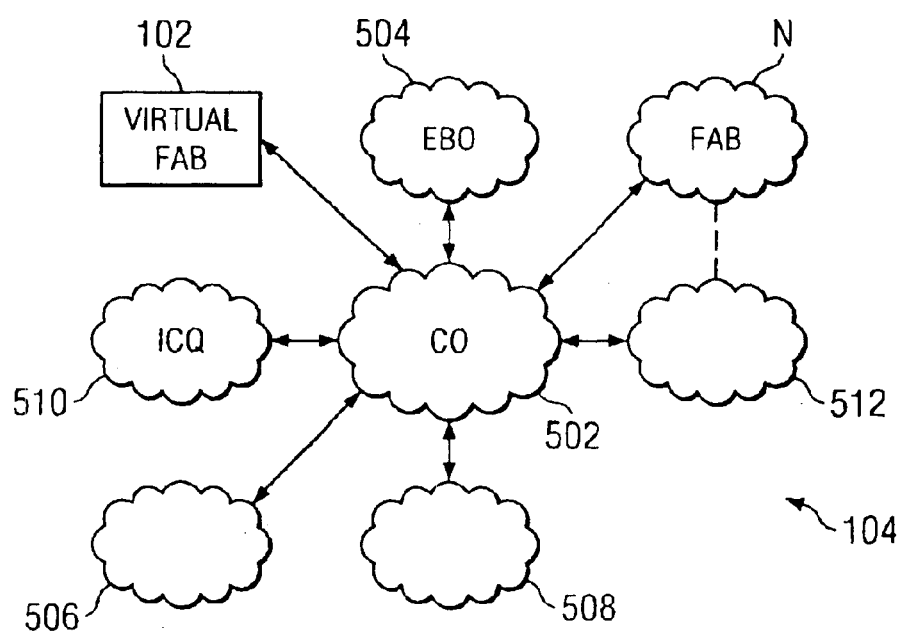
FIG. 5 illustrates a enterprise mask process management system within which the system and method of FIGS. 1 and 4 may be performed.

Referring now to FIG. 5, in one embodiment, the enterprise mask process management system 104 may be coupled or incorporated into the virtual fab 102 and may further include a plurality of entities 502, 504, 506, 508, 510, 512 . . . , N that may be connected by the central entity 502 and coupled to the virtual fab 102. The enterprise mask process management system 104 could be a single system or may be a variety of different systems, interconnected to the virtual fab 102. The enterprise mask process management system 104 central component may be the central operation entity 502 which may act as a daemon that collects data, monitors, and dispatches new information or commands. A daemon may be a system or process which can be transparent to other systems which can perform a plurality of functions. Coupled to the central operation entity 502 may be a plurality of fab entities 506, 508, 512, . . . , N, internal quality control (ICQ) 510, and an electron beam operation (EBO) 504 entity. The EBO 504 entity may provide reticle or mask fabrication which may include a plurality of process steps and of which all may be coupled to the virtual fab 102. The fab entities 506, 508, 512, . . . , N may include any semiconductor manufacturing facility and all embodiments comprising thereof.

Figure 6:
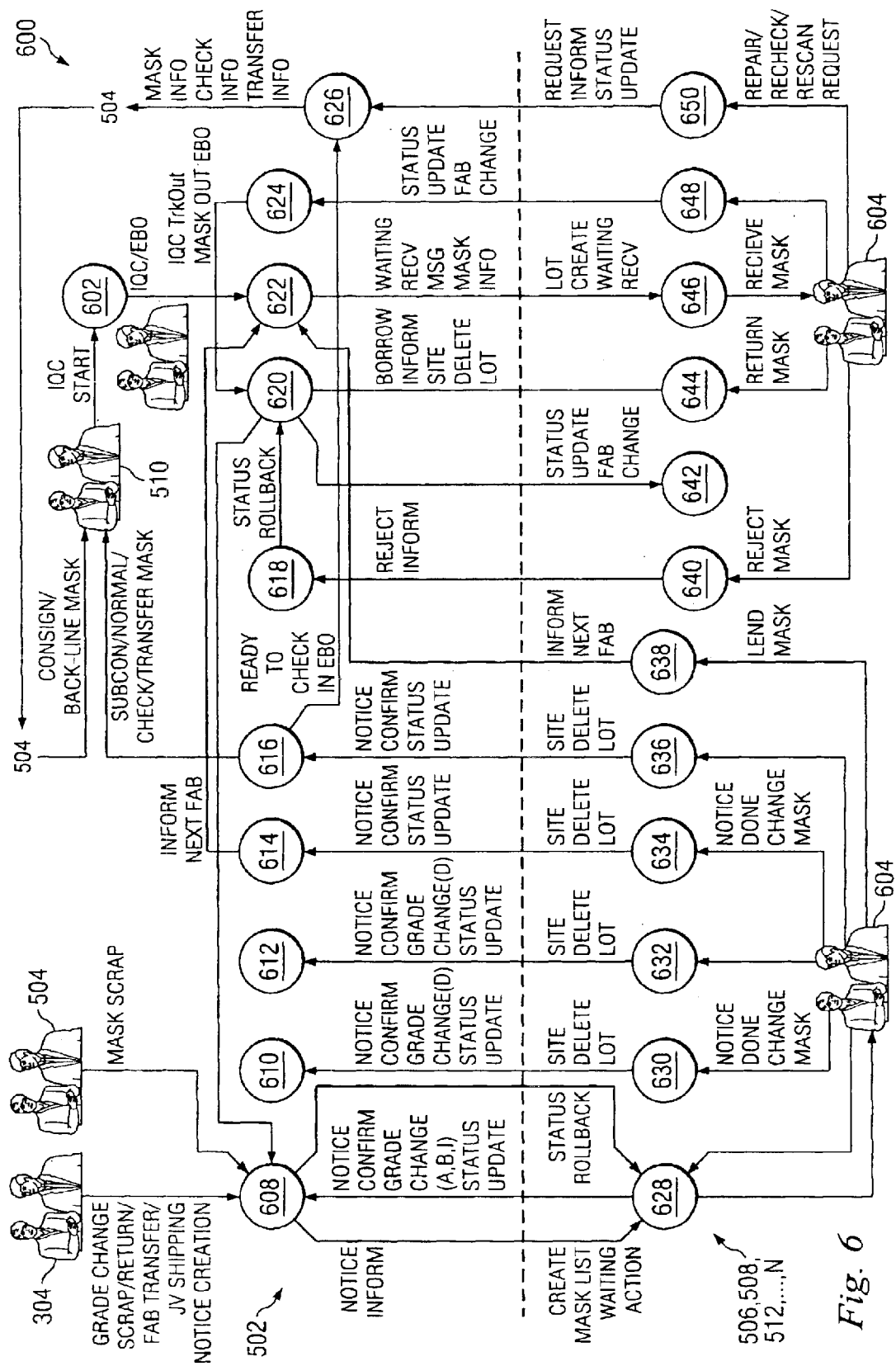
FIG. 6 is a state diagram illustrating the enterprise mask process management system of which the system and method of FIGS. 1 and 4 may be performed within a virtual fab.

Referring now to FIGS. 6, a state diagram 600 illustrates one embodiment of the enterprise mask process management system 104. The state diagram 600 may comprise a plurality of entities such as a central operation entity 502, a EBO 504 entity, an ICQ 510 entity, a plurality of fab entities 506, 508, 512, . . . , N and a plurality of manufacturing entities 604. Coupled to the central operation 502 entity may be the customer 304 and the EBO 504. The EBO 504 may include the ICQ 510 entity and a production work-in-progress (WIP) 602 entity. The EBO 504 may include manufacturing processes for the fabrication of masks and of reticles and can include WIP 602 tracking and ICQ 510 implementation. The EBO 504 may include mask data design, layout, and fabrication. The EBO 504 may include data and mask layout fabrication that may be transferred to a maskless lithographic tool or may be transferred to a plurality of process equipment for the fabrication of a reticle that may be employed in a photolithographic stepper employing a reticle. The EBO 504 can be integrated into the virtual fab 102 and may communicate and interact with other entities, specifically the central operation 502 entity.

The central operation 502 may include a plurality of states 608–626. The states 608–626 can illustrate by graphical depiction the status and action of a specified entity. The states 608–626 of the central operation 502 may carry out and signify many different events including for example, a notice confirmation, a grade change (i.e. priority change), a status update, a transfer operation, a receiving operation, a waiting operation, and any other operation or entity that may be associated with the central operation 502 entity. The states 608–626 may interact with entities of the virtual fab 102, customer(s) 304, the EBO 504, and the states 628–650 of the fab operation 506, 508, 512, . . . , N entities. The states 628–650 of the fab operation 506, 508, 512, . . . , N entities may carry out and signify many different events including for example, a notice confirmation, a grade change (i.e. priority change), a status update, a transfer operation, a receiving operation, a waiting operation, and any other operation or entity that may be associated with the fab operation 506, 508, 512, . . . , N entities. The states 628–650 may be coupled to manufacturing team 604 entities for analysis and decision of any data within the fab operation 506, 508, 512, . . . , N entities.

FIGS. 7–16 illustrate sub-processes within the enterprise mask process management system 104. Referring now to FIG. 7, a mask out process 700 is used to send a mask to the manufacturing team 604. The mask out process 700 may include the transfer of any mask information or mask reticle from the EBO 504 WIP 602 to state 704 of the central operation 502 entity. The central operation 502 entity may include a plurality of states 620–626 wherein mask information or mask reticle may be received, a message may be sent, and any status may be updated. The states 644–650 may interact with the states 620–626 of the fab operation 506, 508, 512, . . . , N where status may be updated, a mask or reticle may be transferred, or any other operation may be updated that may pertain to a mask or reticle being sent to a manufacturing team 604 from the EBO 602.

Figures 8, 10:
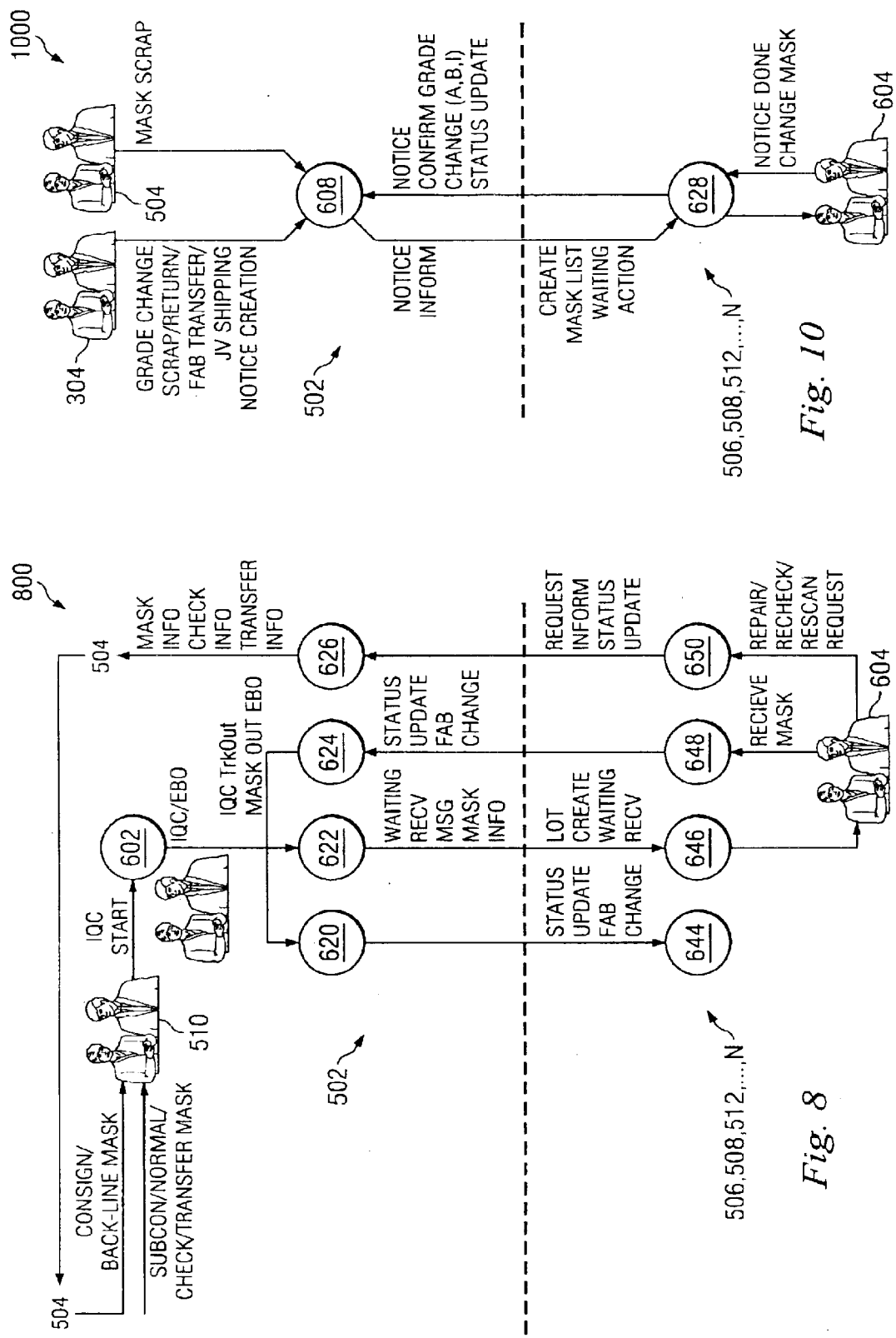

Referring now to FIG. 8, a mask repair, rescan, review, and/or retool process 800 controls and executes the repair a mask, rescanning, or reviewing by quality control. The mask repair, rescan, and review process 800 may begin with any operations executed by the EBO 504 entity wherein ICQ 510 may perform review and quality check of mask information and of the reticle. The rescanning of the mask information or reticle could include a particle scan, or scanning by any other defect sensing equipment. All parts of the reticle or mask information and design would be reviewed by ICQ 510 and then could be transferred to WIP 602. The ICQ 510 may also receive damaged mask information or reticles and the EBO 504 entity would perform any task necessary for repair of any mask information or any physical defect of a reticle or mask. In the case of maskless lithography, mask data may become corrupt and therefore data repair could be performed by ICQ 510 or EBO 504. The central operation 502 can facilitate the transfer, status, and any requests as indicated by the states 620–626. The fab operation 506, 508, 512, . . . , N may include states 644–650 which may communicate with states 620–626 and may indicate transfer, rescan requested, repair or any other commands.

Referring now to FIG. 9, a notice process 900 notifies entities such as the manufacturing team 604 of the creation of a mask or reticle. The entities may be notified of the mask creation 900 upon initiation of mask design and layout or at any other time such as at the fabrication of the final mask or reticle. State 608 of the central operation 502 entity could notify the state 628 of the fab operation 506, 508, 512, . . . , N entity and state 628 could transfer any mask creation information to the manufacturing team 604 or any other associated or appropriate entity. The notice of the creation of a mask may be carried out through the virtual fab 102.

Referring now to FIG. 10, a grade change notice process 1000 notifies entities such as the manufacturing team 604 of the change of a grade of a mask or reticle. The grade may indicate the priority or importance of the mask or reticle and can further indicate the quality of mask information or reticle. The grade may also contain information about age and usage thereof. State 608 of the central operation 502 entity could notify the state 628 of the fab operation 506, 508, 512, ..., N entity and state 628 could transfer any mask grade change notice 1000 information to the manufacturing team 604 or any other associated or appropriate entity. The notice of the grade change notice 1000 of a mask may be carried out through the virtual fab 102.

Referring now to FIG. 11, a mask scrap notice process 1100 notifies entities such as the manufacturing team 604 of the scrapping of a mask or reticle. State 608 of the central operation 502 entity could notify the state 628 of the fab operation 506, 508, 512, ..., N entity and state 628 could transfer any mask scrap notice 1000 information to the manufacturing team 604 or any other associated or appropriate entity. The scrap notice 1100 of a mask may be carried out through the virtual fab 102. The manufacturing team 604 can send back any acknowledgement of the scrap notice 1100 through state 630 of the fab operation 506, 508, 512, ..., N entity and then to the central operation 502 entity wherein the status of a mask or reticle may be updated to the scrap status.

Referring now to FIG. 12, a return to customer notice process 1200 notifies entities such as the manufacturing team 604 and the customer 304 of the return of a mask or reticle. State 608 of the central operation 502 entity could notify the state 628 of the fab operation 510, ..., N entity and state 628 could transfer any mask customer return notice 1200 information to the manufacturing team 604, customer 304, or any other associated or appropriate entity. The customer return notice 1200 of a mask may be carried out through the virtual fab 102. The manufacturing team 604 can send back any acknowledgement of the customer return notice 1200 through state 632 of the fab operation 506, 508, 512, ..., N entity and then to state 612 of the central operation 502 entity wherein the status of a mask or reticle may be updated to the customer return status.

Figure 13:
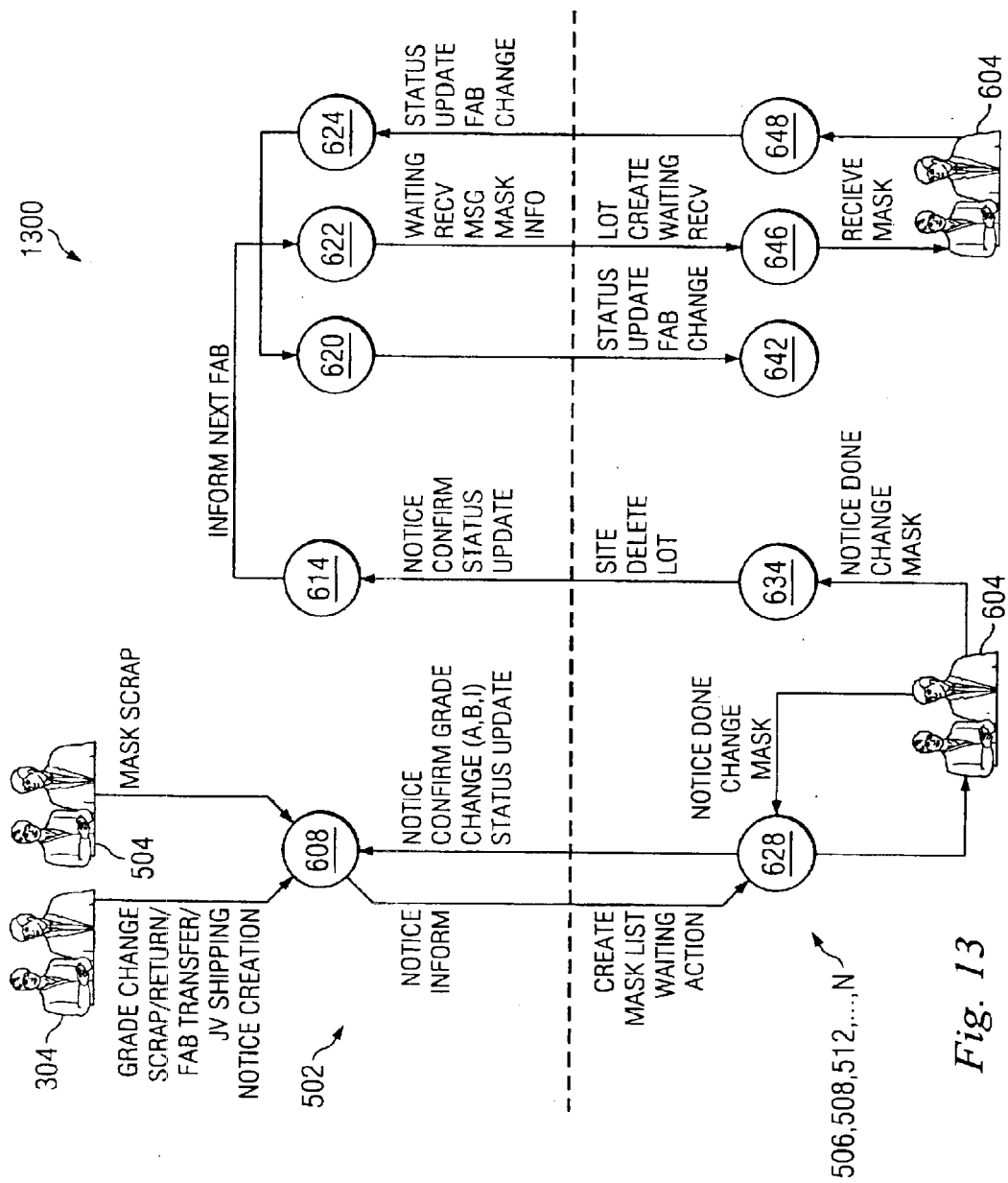

Referring now to FIG. 13, a transfer to another fab notice process 1300 notifies entities such as the manufacturing team 604 and the customer 304 of the transfer to another fab of a mask or reticle. State 608 of the central operation 502 entity could notify the state 628 of the fab operation 510, ..., N entity and state 628 could transfer any mask the transfer to another fab notice 1300 information to the manufacturing team 604, customer 304, or any other associated or appropriate entity. The transfer to another fab notice 1300 of a mask may be carried out through the virtual fab 102. The manufacturing team 604 can send back any acknowledgement of the transfer to another fab notice 1300 through state 634 of the fab operation 506, 508, 512, ..., N entity and then to state 614 of the central operation 502 entity wherein the status of a mask or reticle may be updated to the transfer to another fab status. State 614 may inform the next specified fab or plurality thereof of the transfer to another fab notice 1300 to state 622 of the central operation 502 entity. State 622 may then send the transfer to another fab information to state 646 of the specified fab operation 506, 508, 512, ..., N and then accordingly to the manufacturing team 604. A notification of receipt of the transfer to another fab notice 1300 may be sent from the manufacturing team 604 to state 648 of the specified fab operation 510, ..., N. The state 648 may then send receipt to state 624 of the central operation 502 wherein state 624 may send receipt to state 620 to update the status of the transferred mask or reticle in the central operation 502 entity and in the new fab operation 506, 508, 512, ..., N by state 642.

Figure 14:
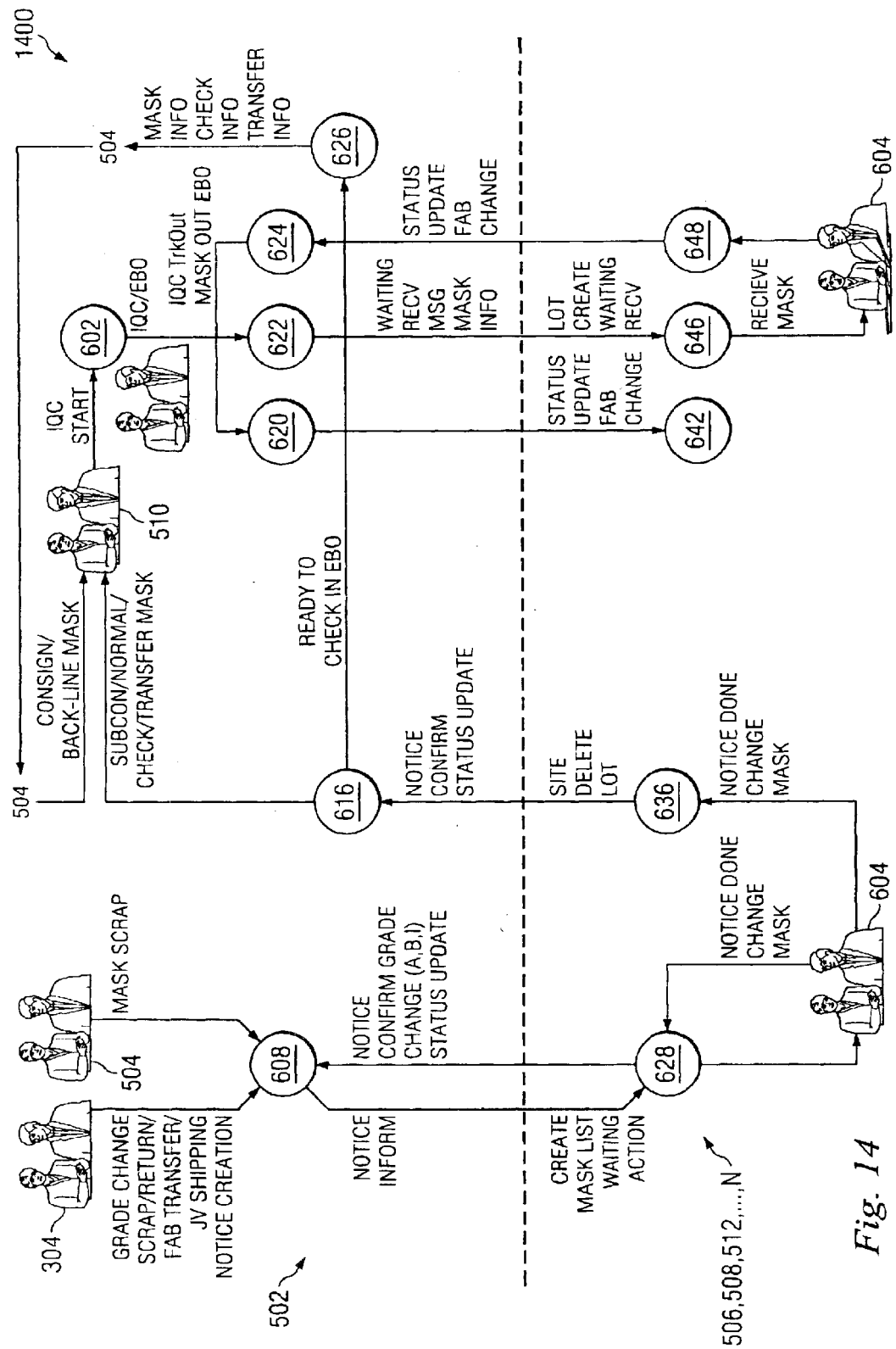

Referring now to FIG. 14, a check transfer to another fab notice process notifies entities such as the manufacturing team 604 and the customer 304 of the check transfer to another fab of a mask or reticle. State 608 of the central operation 502 entity could notify the state 628 of the fab operation 506, 508, 512, ..., N entity and state 628 could transfer any mask the check transfer to another fab notice 1300 information to the manufacturing team 604, customer 304, or any other associated or appropriate entity. The transfer to another fab check notice 1300 of a mask may be carried out through the virtual fab 102. The manufacturing team 604 can send back any acknowledgement of the check transfer to another fab notice 1400 through state 636 of the fab operation 506, 508, 512, ..., N entity and then to state 616 of the central operation 502 entity wherein the status of a mask or reticle may be updated to the check transfer to another fab status. State 616 may inform the next specified fab or plurality thereof of the check transfer to another fab notice 1400 to state 626 of the central operation 502 entity. State 626 may then send the check transfer to another fab information. A notification of receipt of the check transfer to another fab notice 1400 may be sent from the manufacturing team 604 to state 648 of the specified fab operation 510, ..., N. The state 648 may then send receipt to state 624 of the central operation 502 wherein state 624 may send receipt to state 620 to update the status of the check transferred mask or reticle in the central operation 502 entity and in the new fab operation 506, 508, 512, ..., N by state 642. The check transfer to another fab notice 1400 may also be sent to a state 636 of the fab operation 506, 508, 512, ..., N where the check transfer to another fab notice 1400 of the status may be updated by the central operation 502 of the parent fab operation 506, 508, 512, ..., N by state 616. The state 616 may further relay and update the status or acknowledgement of the check transfer to another fab notice 1400 to state 626. State 626 could send information regarding the check transfer to another fab notice 1400 to the EBO 504 where an acknowledgement may be issued to ICQ 510 and where the WIP 602 may be updated as well. The customer 304 can be informed of the change or the check transfer to another fab notice 1400, such that all entities encompassing the enterprise mask process management system 104 and the virtual fab 102 may be notified of any change or movement of masks or reticles. The check transfer to another fab notice 1400 may proceed as a single independent step or may proceed as two independent steps from customer 304 to states 616, 626, EBO 504, and other steps and entities as illustrated.

Figure 15:
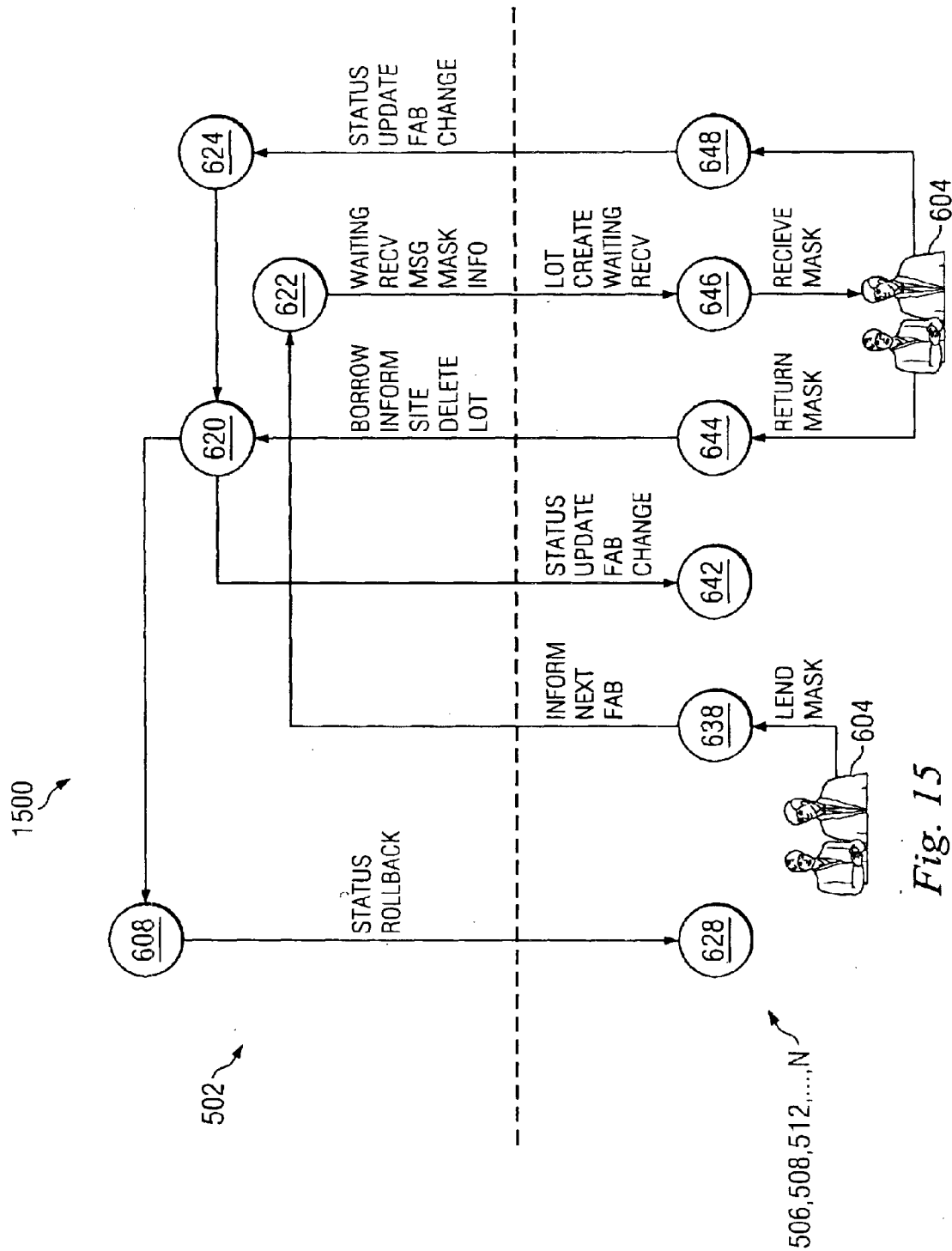

Referring now to FIG. 15, a lending or borrowing notice process 1500 notifies entities such as the manufacturing team 604 of the lending or borrowing of a mask or reticle. State 608 of the central operation 502 entity could notify the state 628 of the fab operation 506, 508, 512, ..., N entity and state 628 could acknowledge any mask the lending or borrowing notice 1500 information. The transfer to another fab check notice 1500 of a mask may be carried out through the virtual fab 102. The manufacturing team 604 can send notice of lending or borrowing of the lending through state 638 of the fab operation 506, 508, 512, ..., N entity and then to state 622 of the central operation 502 entity wherein the status of a mask or reticle may be updated to the lending or borrowing status. State 622 may inform the next specified fab or plurality thereof of the lending or borrowing fab notice 1500 to state 646 of the central operation 502 entity. State 646 may then send the lending or borrowing to another fab information of the specified fab operation 506, 508, 512, . . . , N and then accordingly to the manufacturing team 604 of the specified. A notification of receipt of the lending or borrowing to another fab notice 1500 may be sent from the manufacturing team of the specified fab 604 to state 648 of the specified fab operation 510, . . . , N. The state 648 may then send receipt to state 624 and 644 of the central operation 502 wherein state 624 may send receipt to state 620 to update the status of the borrowed mask or reticle in the central operation 502 entity and in the new fab operation 506, 508, 512, . . . , N by state 642. State 644 may include the return of the mask or reticle wherein state 620 may be informed of the borrowing or lending of a mask or reticle. The lending or borrowing notice 1500 may also be sent to a state 636 of the fab operation 506, 508, 512, . . . , N where the lending or borrowing to another fab notice 1500 of the status may be updated by the central operation 502 of the specified fab operation 506, 508, 512, . . . , N by state 622. The state 616 may further relay and update the status or acknowledgement of the check lending or borrowing notice 1500 to state 620. State 620 could send information regarding borrowing or lending notice 1500 to the state 608 of the parent fab. All entities encompassing the enterprise mask process management system 104 and the virtual fab 102 may be notified of any change or movement of masks or reticles.

Figure 16:
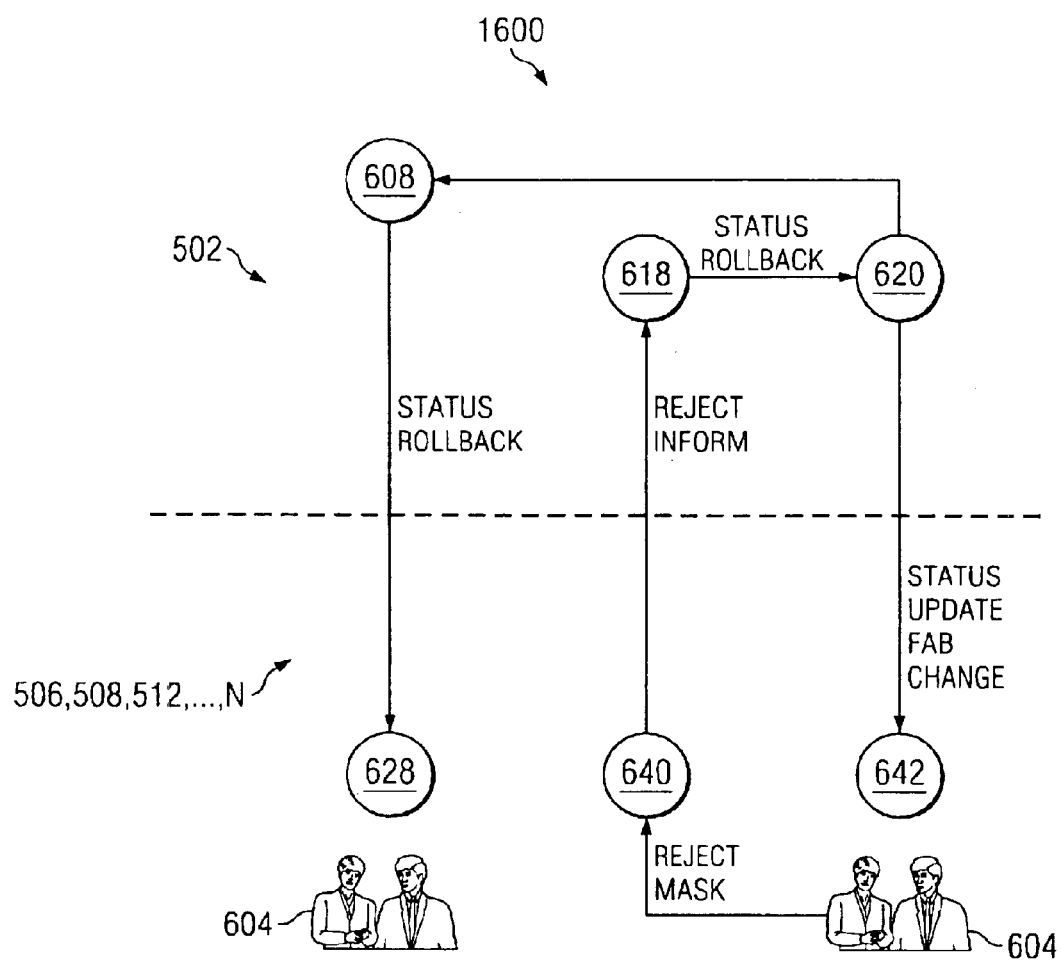

Referring now to FIG. 16, a mask rejection notice process 1600 notifies entities such as the manufacturing team 604 of the specified or parent fab and the customer 304 of the rejection of a mask or reticle. State 608 of the central operation 502 entity could notify the state 628 of the fab operation 506, 508, 512, . . . , N entity and state 628 could transfer any mask the mask rejection notice 1600 information to the manufacturing team 604, customer 304, or any other associated or appropriate entity. The transfer to another fab check notice 1500 of a mask may be carried out through the virtual fab 102. The manufacturing team 604 of the specified fab can send back any acknowledgement of the mask rejection notice 1600 through state 640 of the fab operation 506, 508, 512, . . . , N entity and then to state 618 of the central operation 502 entity wherein the status of a mask or reticle may be updated to the lending or borrowing status. State 618 may inform (or roll back) the next specified fab or plurality thereof of the mask rejection notice 1600 to state 620 of the central operation 502 entity. State 620 may then send the lending or borrowing to another fab (or parent) information to state 608 of the specified fab operation 506, 508, 512, . . . , N and then accordingly to the manufacturing team 604 and customer 304. Stat 620 may update state 642 the specified fab 506, 508, 512, . . . , N of mask rejection.

The present disclosure has been described relative to a preferred embodiment. Improvements or modifications that become apparent to persons of ordinary skill in the art only after reading this disclosure are deemed within the spirit and scope of the application. It is understood that several modifications, changes and substitutions are intended in the foregoing disclosure and in some instances some features of the disclosure will be employed without a corresponding use of other features. Accordingly, it is appropriate that the appended claims be construed broadly and in a manner consistent with the scope of the disclosure.

What is claimed is:

1. A computer-executable method for tracking and managing a plurality of lithographic masks through a semiconductor manufacturing environment, wherein the method is embodied in a plurality of instructions for execution by a processor and stored on a memory accessible to the processor, the method comprising:

establishing a virtual fab with a plurality of entities, each entity associated with an internal process to a semiconductor fab or an external process to the semiconductor fab, wherein at least one of the entities includes a service system interface for communicating between a computer system associated with a customer external to the virtual fab and a computer system associated with the virtual fab;

defining a state diagram for tracking the plurality of lithographic masks through the plurality of entities of the virtual fab;

placing each of the plurality of lithographic masks at a pre-determined state of the state diagram;

determining a future location for each of the masks in the virtual fab via the state diagram;

enabling the customer to identify the pre-determined state of a particular mask and to alter the future state of that particular mask via the service system interface.

2. The method of claim 1, wherein at least one of the lithographic masks is a physical mask reticle.

3. The method of claim 1, wherein at least one of the entities is a manufacturing executing system used to facilitate production in the semiconductor fab.

4. The method of claim 1, wherein at least one of the entities is a manufacturing team interface for communicating with personnel associated with the semiconductor fab.

5. The method of claim 1, wherein at least one of the entities represents a specific process used within the semiconductor fab.

6. The method of claim 1, wherein at least one of the entities is a service system interface for communicating between a computer system associated with an external service provider and a computer system associated with the semiconductor fab.

7. The method of claim 6, wherein the external service provider is a reticle manufacturer.

8. The method of claim 6, wherein the external service provider is a separate fab.

9. The method of claim 1, wherein the virtual fab comprises a plurality of processes of the semiconductor fab.

10. A system for tracking and managing a plurality of lithographic masks through a semiconductor manufacturing environment, the system comprising:

at least one processor;

at least one memory coupled to the processor; and a plurality of instructions stored on the memory for execution by the processor, the instructions including:

a first group of instructions for establishing a virtual fab having a plurality of entities;

a second group of instructions for establishing an enterprise mask management system, wherein the enterprise mask management system includes a service system interface for communicating with a customer external to the virtual fab;

a third group of instructions for establishing and maintaining a plurality of state diagrams, the state diagrams having a plurality of states corresponding to the entities of the virtual fab, and the maintaining including updating a progression of a mask through the states being controlled by the enterprise mask management system; and a fourth group of instructions for enabling the customer to identify the state of a particular mask and to alter the progression of the mask through the states via the service system interface.

11. The system of claim 10, wherein the enterprise mask management system comprises a central entity for managing the progression of states via the state diagram.

12. The system of claim 10, wherein the enterprise mask management system comprises an internal quality control entity for providing control of a predetermined quality of the masks.

13. The system of claim 10, wherein at least one of the lithographic masks is a physical mask reticle.

14. The system of claim 10, wherein at least one of the lithographic masks is represented by a group of data stored in the memory.

15. An enterprise mask process management system for managing a plurality of lithographic masks within a virtual fabrication environment, the system comprising:

an interface coupling a customer external to the virtual fabrication environment with the enterprise mask process management system;

a fabrication entity internal to the virtual fabrication environment and including a plurality of fabrication states, wherein each of the fabrication states defines one or more operations performed by the fabrication entity with respect to a mask;

a central operation entity internal to the virtual fabrication environment and coupled to the customer via the interface, wherein the central operation entity includes a plurality of management states defining operations for managing a mask outside of the fabrication entity and for communicating with the fabrication facility using at least one of the fabrication states; and a processor coupled to a memory and accessible to the enterprise mask process management system for executing a plurality of instructions stored on the memory, the instructions including:

instructions for maintaining a state diagram associating each of the masks with one of the fabrication or management states, wherein the state diagram is updated as a mask is transferred from one state to another;

instructions for determining a future state for each of the masks within the virtual fabrication environment using the state diagram; and instructions for enabling the customer to monitor a mask and its associated state and to alter at least one of the associated state or the future state for the mask via the central operation entity.

* * * * *